(12) United States Patent
Lee (10) Patent No.: US 6,614,702 B2
(45) Date of Patent: Sep. 2, 2003

(54) SEMICONDUCTOR MEMORY DEVICES AND METHODS INCLUDING COUPLING AND/OR FLOATING ISOLATION CONTROL SIGNAL LINES

(75) Inventor: Jae-goo Lee, Seongnam (KR)

(73) Assignee: Samsung Electronics Co., Ltd, Kyungki-do (KR)

( * ) Notice: Subject to any disclaimer, the term of this patent is extended or adjusted under 35 U.S.C. 154(b) by 0 days.

(21) Appl. No.: 10/136,606

(22) Filed: May 1, 2002

(65) Prior Publication Data

US 2003/0002373 A1 Jan. 2, 2003

(30) Foreign Application Priority Data

Jun. 30, 2001 (KR) .................................... 2001-0038814

(51) Int. Cl.[7] ................................................. G11C 7/00
(52) U.S. Cl. ...................... 365/205; 365/63; 365/189.09
(58) Field of Search ................................ 365/205, 208, 365/189.09, 63, 230.06, 154; 327/52, 55, 57

(56) References Cited

U.S. PATENT DOCUMENTS 6,166,977 A * 12/2000 Saitoh et al. ............... 365/205
6,201,749 B1 * 3/2001 Fujita ......................... 365/203
6,538,945 B2 * 3/2003 Takemura et al. .......... 365/205

* cited by examiner

Primary Examiner—David Nelms
Assistant Examiner—Gene N. Auduong
(74) Attorney, Agent, or Firm—Myers Bigel Sibley & Sajovec (57) ABSTRACT

A semiconductor memory device may include a memory cell array comprising a plurality of memory cells, a pair of bit lines coupled to at least one memory cell of the memory cell array, a sense amplifier having a pair of sense amplifier inputs wherein the sense amplifier senses a difference between voltages of the pair of sense amplifier inputs and amplifies the voltage difference, and a pair of isolation switches. More particularly, each isolation switch of the pair can be coupled between one of the pair of bit lines and one of the pair of sense amplifier inputs wherein the pair of isolation switches electrically couples the respective bit lines and the sense amplifier inputs responsive to a coupling signal provided on an isolation control signal line coupled to control electrodes of the isolation switches. In addition, a control switch can be coupled between the isolation control signal line and a power voltage node of the sense amplifier wherein the control switch electrically couples the isolation control signal line to the power voltage node of the sense amplifier during a first period of operation of the sense amplifier for the memory cell. Related methods are also discussed.

53 Claims, 9 Drawing Sheets

SEMICONDUCTOR MEMORY DEVICES AND METHODS INCLUDING COUPLING AND/OR FLOATING ISOLATION CONTROL SIGNAL LINES

RELATED APPLICATION

This application claims the benefit of Korean Patent Application No. 2001-0038814, filed Jun. 30, 2001, the disclosure of which is hereby incorporated herein by reference in its entirety as if set forth fully herein.

BACKGROUND OF THE INVENTION

The present invention relates to semiconductor memory devices, and more particularly, to semiconductor memory devices including sense amplifiers and related methods.

Semiconductor memory devices have been developed to provide increased storage capacities, operate at higher speeds, and consume less power. In particular, dynamic random access memories (DRAMs) may include shared bitline sense amplifiers, which are shared by two adjacent memory cell array blocks, and may use a memory cell array power voltage as a shared bitline sense amplifier power voltage. A memory cell array power voltage may be generated by internally reducing an external power voltage applied from outside the memory device.

Figure 1:
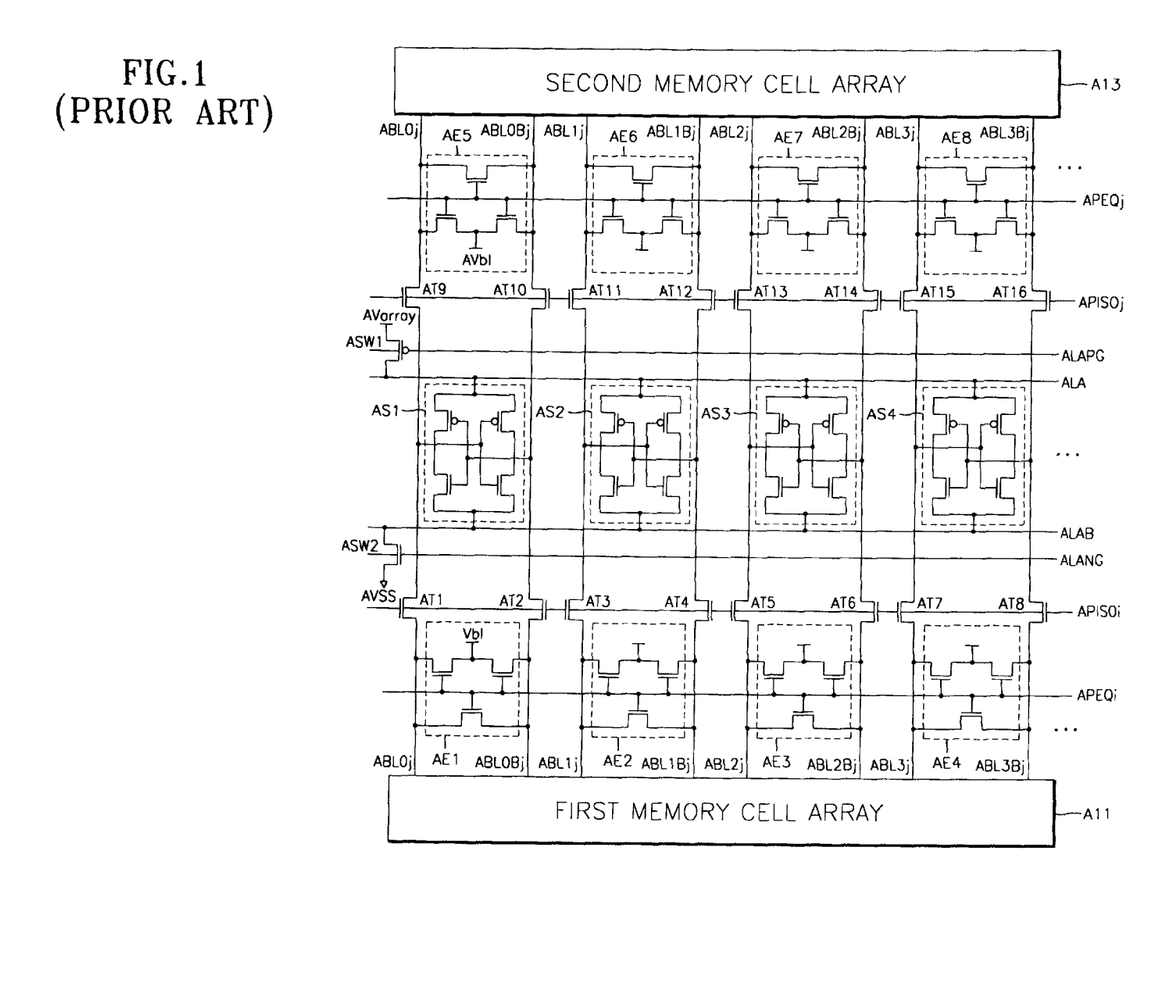
FIG. 1 is a circuit diagram of a conventional dynamic random access memory (DRAM).
Figure 2:
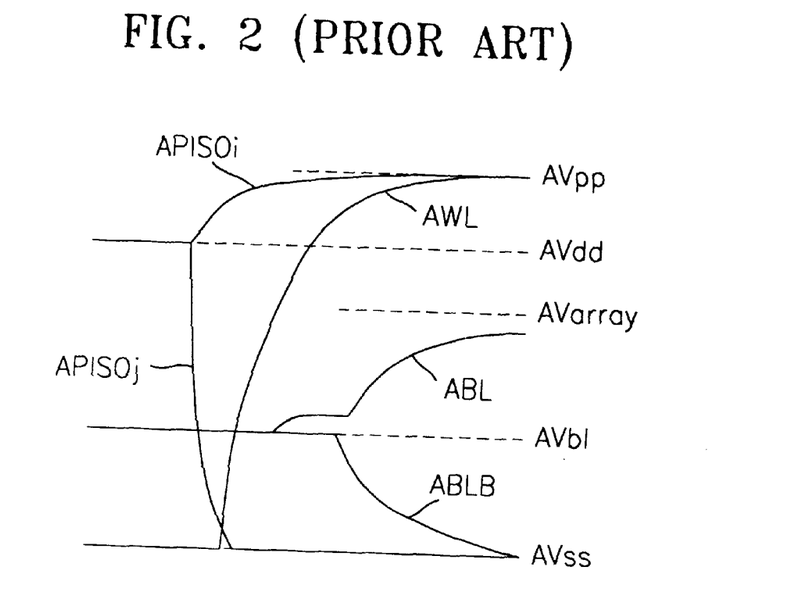
FIG. 2 is a waveform diagram illustrating the operation of sense amplifiers in the conventional DRAM shown in FIG. 1.

FIG. 1 is a circuit diagram of a conventional DRAM, and FIG. 2 is a waveform diagram illustrating the operation of sense amplifiers in the conventional DRAM of FIG. 1. Referring to FIG. 1, bitline sense amplifiers AS1 through AS4 are shared by two adjacent memory cell array blocks A11 and A13. Pairs of bitlines ABL0i/ABL0Bi through ABL3i/ABL3Bi connected to the first memory cell array block A11 are equalized to a voltage level AVb1 by equalization circuits AE1 through AE4. Pairs of bitlines ABL0j/ABL0Bj through ABL3j/ABL3Bj connected to the second memory cell array block A13 are equalized to the voltage level AVb1 by equalization circuits AE5 through AE8.

Next, as shown in FIG. 2, a first isolation control signal APISOi and a second isolation control signal APISOj reach an external power voltage level AVdd. If the first isolation control signal APISOi reaches a boosting voltage AVpp level and the second isolation control signal APISOj drops to a ground voltage level AVss, pairs of first isolation transistors AT1 through AT8 are turned on and pairs of second isolation transistors AT9 through AT16 are turned off. In other words, the first memory cell array block A11 is selected, and the second memory cell array block A13 is not selected.

Next, a wordline AWL of a memory cell in the first memory cell array block A11 reaches the boosting voltage level AVpp. If a sense amplifier control signal ALAPG becomes logic 'low' and an inverted signal ALANG of the sense amplifier control signal ALAPG becomes logic 'high', the sense amplifiers AS1 through AS4 start to operate. In other words, a first switch ASW1 is turned on, and then a memory cell array power voltage AVarray is supplied to a power voltage node ALA of the sense amplifiers AS1 through AS4. Then, a second switch ASW2 is turned on, and ground voltage AVSS is supplied to a ground voltage node ALAB of the sense amplifiers AS1 through AS4. Then, the sense amplifiers AS1 through AS4 sense and amplify the data of the pairs of bitlines ABL0i/ABL0Bi through ABL3i/ABL3Bi connected to the first memory cell array block A11.

In such a method shown in FIG. 2, the pairs of first isolation transistors AT1 through AT8 are previously turned on at an early stage of the operation of the sense amplifiers AS1 through AS4 by the first isolation control signal APISOi almost reaching the boosting voltage level AVpp, and thus the load of the pairs of bitlines ABL0i/ABL0Bi through ABL3i/ABL3Bi connected to the selected memory cell array block (the first memory cell array block A11) increases. Accordingly, the operational characteristics of the sense amplifiers AS1 through AS4 may deteriorate and the amplification speed of the sense amplifiers AS1 through AS4 may be reduced.

Figure 3:
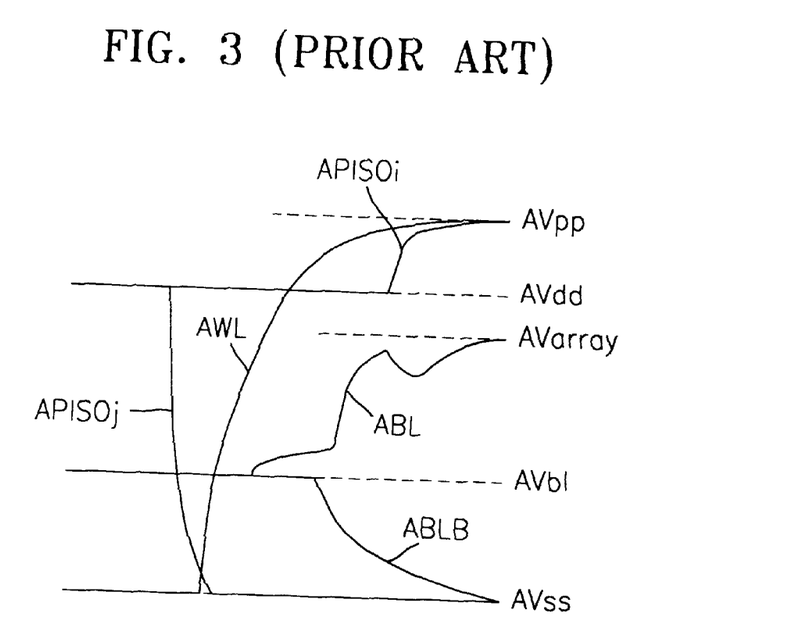
FIG. 3 is another waveform diagram illustrating the operation of sense amplifiers in the conventional DRAM shown in FIG. 1.

FIG. 3 is another waveform diagram illustrating the operation of sense amplifiers of the conventional DRAM shown in FIG. 1. The method shown in FIG. 3 may address problems with the method shown in FIG. 2 discussed above.

In the method shown in FIG. 3, the first and second isolation control signals APISOi and APISOj reach the external power voltage level AVdd at an early stage of the operation of the sense amplifiers AS1 through AS4, and then the first isolation control signal APISOi maintains the external power voltage level AVdd and the second isolation control signal APISOj drops to the ground voltage level AVss. The first isolation control signal APISOi reaches the boosting voltage level AVpp at a middle stage of the operation of the sense amplifiers AS1 through AS4.

Accordingly, in the method shown in FIG. 3, the pairs of first isolation transistors AT1 through AT8 are weakly turned off by the first isolation control signal APISOi at the external power voltage level AVdd, and, thus, the load of the pairs of bitlines ABL0i/ABL0Bi through ABL3i/ABL3Bi connected to the selected memory cell array block (the first memory cell array block A11) decreases. As a result, the amplification speed of the sense amplifiers AS1 through AS4 may be increased using operations shown in FIG. 3.

However, because the pairs of first isolation transistors AT1 through AT8 may not completely turn off at an early stage of the operation of the sense amplifiers AS1 through AS4, the load of the pairs of bitlines ABL0i/ABL0Bi through ABL3i/ABL3Bi may not be sufficiently blocked.

SUMMARY OF THE INVENTION

According to embodiments of the present invention, a semiconductor memory device may include a memory cell array comprising a plurality of memory cells, a pair of bit lines coupled to at least one memory cell of the memory cell array, a sense amplifier having a pair of sense amplifier inputs wherein the sense amplifier senses a difference between voltages of the pair of sense amplifier inputs and amplifies the voltage difference, and a pair of isolation switches. More particularly, each isolation switch of the pair can be coupled between one of the pair of bit lines and one of the pair of sense amplifier inputs wherein the pair of isolation switches electrically couples the respective bit lines and the sense amplifier inputs responsive to a coupling signal provided on an isolation control signal line coupled to control electrodes of the isolation switches. In addition, a control switch can be coupled between the isolation control signal line and a power voltage node of the sense amplifier wherein the control switch electrically couples the isolation control signal line to the power voltage node of the sense amplifier during a first period of operation of the sense amplifier for the memory cell.

According to additional embodiments of the present invention, an integrated circuit memory device can include a memory cell array comprising a plurality of memory cells, a pair of bit lines coupled to at least one memory cell of the memory cell array, a sense amplifier having a pair of sense amplifier inputs wherein the sense amplifier senses a difference between voltages of the pair of sense amplifier inputs and amplifies the voltage difference, and a pair of isolation switches. More particularly, each isolation switch of the pair can be coupled between one of the pair of bit lines and one of the pair of sense amplifier inputs wherein the isolation switches electrically couple the respective bit lines and the sense amplifier inputs responsive to a coupling signal provided on an isolation control signal line coupled to control electrodes of the isolation switches. In addition, an isolation control signal generator can be coupled to the isolation control signal line wherein the isolation control signal generator generates the coupling signal during operation of the sense amplifier for the memory cell array. Moreover, the isolation control signal generator can allow the isolation control signal line to float with respect to the isolation control signal generator during a first period of operation of the sense amplifier for the memory cell array.

Devices and methods according to embodiments of the present invention may thus reduce loading of sense amplifiers from bitlines during early stages of sense amplifier operation and increase amplification speeds of sense amplifiers.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Embodiments of the present invention are illustrated, for examples, with MOS transistors of particular channel conductivity types and/or signals of certain logic values. It will be understood, however, that transistors of different channel conductivity types and/or signals of different logic values may be used. Like numbers refer to like elements throughout.

It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 4:
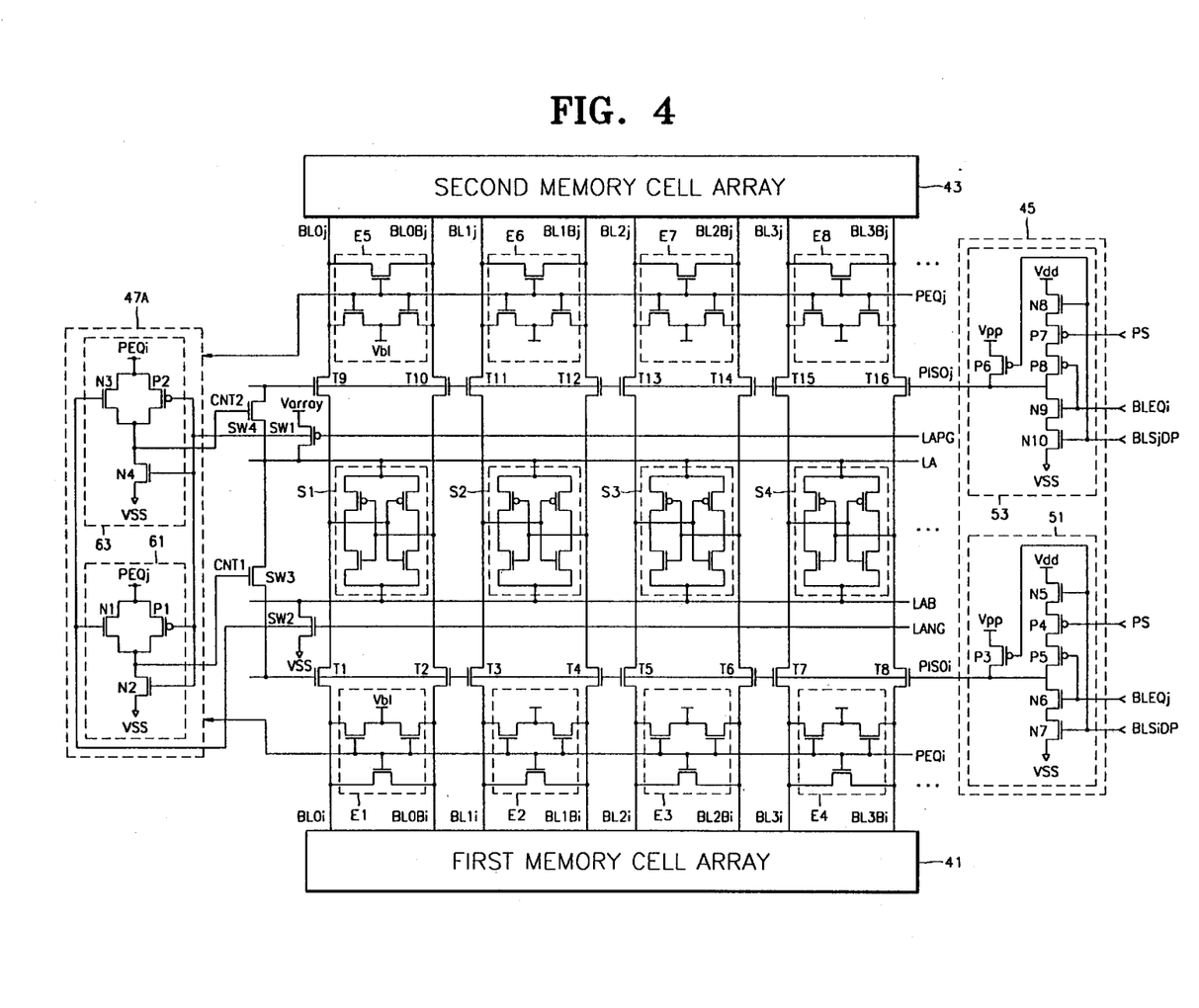
FIG. 4 is a circuit diagram of dynamic random access memories (DRAMs) according to first embodiments of the present invention.

FIG. 4 is a circuit diagram of a dynamic random access memory (DRAM) according to first embodiments of the present invention. For the convenience of explanation, only two memory cell array blocks and their related circuits are illustrated in FIG. 4.

Referring to FIG. 4, a DRAM according to first embodiments of the present invention includes a first memory cell array block 41, pairs of first bitlines BL0i/BL0Bi through BL3i/BL3Bi coupled to the first memory cell array block 41, first equalization circuits E1 through E4 for equalizing the pairs of first bitlines BL0i/BL0Bi through BL3i/BL3Bi in response to a first equalization signal PEQi, a second memory cell array block 43, pairs of second bitlines BL0j/BL0Bj through BL3j/BL3Bj coupled to the second memory cell array block 43, and second equalization circuits E5 through E8 for equalizing the pairs of second bitlines BL0j/BL0Bj through BL3j/BL3Bj.

In addition, a DRAM according to first embodiments of the present invention can further include pairs of first isolation transistors T1 through T8, pairs of second isolation transistors T9 through T16, shared sense amplifiers S1 through S4, a first switch SW1, and a second switch SW2.

The pairs of first isolation transistors T1 through T8 connect/isolate input pairs of the shared sense amplifiers S1 through S4 to/from the pairs of first bitlines BL0i/BL0Bi through BL3i/BL3Bi in response to the first isolation control signal PISOi. The pairs of second isolation transistors T9 through T16 connect/isolate the input pairs of the shared sense amplifiers S1 through S4 to/from the pairs of second bitlines BL0j/BL0Bj through BL3j/BL3Bj in response to the second isolation control signal PISOj. The pairs of isolation transistors T1 through T16 can be NMOS transistors.

The first switch SW1 can be a PMOS transistor and can transmit the memory cell array power voltage Varray to the power voltage node LA of the shared sense amplifiers S1 through S4 in response to a sense amplifier control signal LAPG. The second switch SW2 can be an NMOS transistor and can transmit the ground voltage VSS to the ground voltage node LAB of the shared sense amplifiers Si through S4 in response to an inverted signal LANG of the sense amplifier control signal LAPG. The memory cell array power voltage Varray is generated by dropping the external power voltage.

The shared sense amplifiers S1 through S4 sense and amplify a difference between the voltages of the pairs of first bitlines BL0i/BL0Bi through BL3i/BL3Bi or the pairs of second bitlines BL0j/BL0Bj through BL3j/BL3Bj. For example, if the first isolation control signal PISOi drops to a ground voltage level Vss and the second isolation control signal PISOj reaches a boosting voltage level Vpp, which is higher than the external power voltage level Vdd, the pairs of first isolation transistors T1 through T8 are turned off, and the pairs of second isolation transistors T9 through T16 are turned on. Accordingly, the pairs of first bitlines BL0i/BL0Bi through BL3i/BL3Bi are decoupled from the input pairs of the shared sense amplifiers S1 through S4, and the pairs of second bitlines BL0j/BL0Bj through BL3j/BL3Bj are coupled to the input pairs of the shared sense amplifiers S1 through S4. The shared sense amplifiers S1 through S4 can then sense a difference in voltage between the pairs of second bitlines BL0j/BL0Bj through BL3j/BL3Bj.

Some elements of DRAMs of the present invention which have been described above may be similar to those of a conventional DRAM. In addition, the structure and operation of the equalization circuits E1 through E8 and the sense amplifiers S1 through S4 are known to those skilled in the art, and thus their descriptions will be omitted here.

A DRAM according to first embodiments of the present invention may further include a third switch SW3, a fourth switch SW4, a control signal generation circuit 47A, and an isolation control circuit 45. Inclusion of these additional elements may increase an amplification speed of sense amplifiers S1 through S4 by sufficiently blocking a load of pairs of bitlines at an early stage of operation of the sense amplifiers S1 through S4. In DRAMs according to first embodiments of the present invention, the third switch SW3, the fourth switch SW4, and the control signal generation circuit 47a may be in a conjunction region located between memory cell array blocks. The isolation control circuit 45 may be arranged in a peripheral circuit region.

The third switch SW3 transmits the first isolation control signal PISOi to the power voltage node LA of the shared sense amplifiers S1 through S4 in response to the activation of a first control signal CNT1. The fourth switch SW4 transmits the second isolation control signal PISOj to the power voltage node LA of the shared sense amplifiers S1 through S4 in response to the activation of a second control signal CNT2. Here, the third and fourth switches SW3 and SW4 may be NMOS transistors.

The control signal generation circuit 47A generates the first and second control signals CNT1 and CNT2 and activates the first or second control signals CNT1 or CNT2 for a first period during the operation of the sense amplifiers S1 through S4. The first period corresponds to the logic 'high' period of the control signal CNT1 shown in FIG. 5.

The isolation control circuit 45 generates the first and second isolation control signals PISOi and PISOj. The isolation control circuit 45 may float a transmission line, along which the first isolation control signal PISOi is transmitted, in response to a pulse signal PS at an early stage of the operation of the sense amplifiers S1 through S4, that is, for a second period in the first period when the first control signal CNT1 is activated. In other words, the transmission line along which the first isolation control signal PISOi is transmitted may float with respect to the isolation control circuit 45 in response to the pulse signal PS so that electric charges may not be compensated for.

The isolation control circuit 45 may also float a transmission line, along which the second isolation control signal PISOj is transmitted, in response to the pulse signal PS at an early stage of the operation of the sense amplifiers S1 through S4, that is, for a second period in the first period when the first control signal CNT2 is activated. In other words, the transmission line along which the second isolation control signal PISOj is transmitted may float with respect to the isolation control circuit 45 in response to the pulse signal PS so that electric charges may not be compensated for. In this context, a transmission line may float with respect to the isolation control circuit 45 by providing a high impedance termination at the isolation control circuit. The second period corresponds to the logic 'high' period of the pulse signal PS shown in FIG. 6.

Accordingly, the electric charges of the transmission line of the first isolation control signal PISOi may rapidly discharge through the third switch SW3 and the sense amplifiers S1 through S4 during the period when the transmission line of the first isolation control signal PISOi is floated at an early stage of the operation of the sense amplifiers S1 through S4. In addition, the electric charges of the transmission line of the second isolation control signal PISOj may rapidly discharge through the fourth switch SW4 and the sense amplifiers S1 through S4 during the period when the transmission line of the second isolation control signal PISOj may float with respect to the isolation control circuit at an early stage of the operation of the sense amplifiers S1 through S4.

Figure 7:
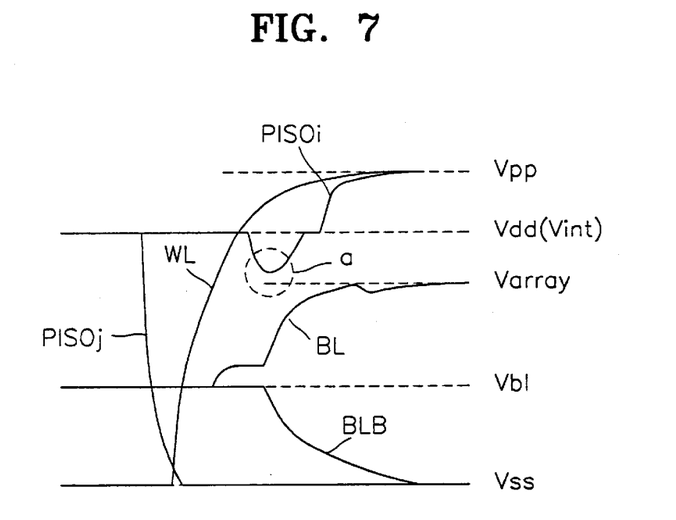
FIG. 7 is a waveform diagram illustrating operations of sense amplifiers according to first embodiments of the present invention.

Thus, as shown in FIG. 7, the level of the first or second isolation control signal PISOi or PISOj can be significantly lower than the external power voltage level Vdd at an early stage of the operation of the sense amplifiers S1 through S4. Accordingly, the pairs of first isolation transistors T1 through T8 may be completely turned off. Thus, the load of the pairs of bitlines BL0i/BL0Bi through BL3i/BL3Bi can be reduced, and the amplification speed of the sense amplifiers S1 through S4 can be increased.

The control signal generation circuit 47A includes a first control signal generator 61 for generating the first control signal CNT1 and a second control signal generator 63 for generating the second control signal CNT2. The first control signal generator 61 generates the first control signal CNT1 in response to the sense amplifier control signal LAPG, the inverted signal LANG of the sense amplifier control signal LAPG, and a second equalization signal PEQj. The second control signal generator 63 generates the second control signal CNT2 in response to the sense amplifier control signal LAPG, the inverted signal LANG of the sense amplifier control signal, and a first equalization signal PEQi.

The first control signal generator 61 may include a PMOS transistor P1, an NMOS transistor N1, and an NMOS transistor N2. The second equalization signal PEQj can be applied to one of the source and the drain of the PMOS transistor P1, the sense amplifier control signal LAPG can be applied to the gate of the PMOS transistor P1, and the other of the source and the drain of the PMOS transistor P1 can be connected to an output node to which the first control signal CNT1 is output. The second equalization signal PEQj can be applied to one of the source and the drain of the NMOS transistor N1, the inverted signal LANG of the sense amplifier control signal LAPG can be applied to the gate of the NMOS transistor, and the other of the source and the drain of the NMOS transistor N1 can be connected to the output node. One of the source and the drain of the NMOS transistor N2 can be connected to the output node, the sense amplifier control signal LAPG can be applied to the gate of the NMOS transistor N2, and the ground voltage Vss can be applied to the other of the source and the drain of the NMOS transistor N2.

The second control signal generator 63 may include a PMOS transistor P2, an NMOS transistor N3, and an NMOS transistor N4. The first equalization signal PEQi can be applied to one of the source and the drain of the PMOS transistor P2, the sense amplifier control signal LAPG can be applied to the gate of the PMOS transistor P2, and the other of the source and the drain of the PMOS transistor P2 can be connected to an output node to which the second control signal CNT2 is output. The first equalization signal PEQi is applied to one of the source and the drain of the NMOS transistor N3, and the inverted signal LANG of the sense amplifier control signal LAPG is applied to the gate of the NMOS transistor N3, the other of the source and the drain of the NMOS transistor N3 can be connected to the output node. One of the source and the drain of the NMOS transistor N4 can be connected to the output node, the sense amplifier control signal LAPG can be applied to the gate of the NMOS transistor N4, and the ground voltage Vss can be applied to the other of the source and the drain of the NMOS transistor N4.

The isolation control circuit 45 may include a first isolation control signal generator 51 and a second isolation control signal generator 53. The first isolation control signal generator 51 may generate the first isolation control signal PISOi in response to control signals BLEQj and BLSiDP and the pulse signal PS and may float the transmission line, along which the first isolation control signal PISOi is transmitted, during the logic 'high' period of the pulse signal PS. The second isolation control signal generator 53 may generate the second isolation control signal PISOj in response to control signals BLEQi and BLSjDP and the pulse signal PS and may float the transmission line, along which the second isolation control signal PISOj is transmitted, during the logic 'high' period of the pulse signal PS.

The first isolation control signal generator 51 may include PMOS transistors P3, P4, and P5 and NMOS transistors N5, N6, and N7. The PMOS transistor P3 can be connected between an output node to which the first isolation control signal PISOi is output and the boosting voltage Vpp, which is higher than the external power voltage Vdd. The control signal BLSiDP can be applied to the gate of the PMOS transistor P3. The NMOS transistor N5, the PMOS transistor P4, and the PMOS transistor P5 can be connected in series between the output node and the external power voltage Vdd. The NMOS transistor N6 and the NMOS transistor N7 can be connected in series between the output node and the ground voltage Vss. The control signal BLSiDP can be applied to the gates of the NMOS transistors N5 and N7. The pulse signal PS having a pulse corresponding to the second period can be applied to the gate of the PMOS transistor P4. The control signal BPLEQj can be applied to the gates of the PMOS transistor P5 and the NMOS transistor N6.

The second isolation control generator 53 may include PMOS transistors P6, P7, and P8 and NMOS transistors N8, N9, and N10. The PMOS transistor P6 can be connected between an output node to which the second isolation control signal PISOj is output and the boosting voltage Vpp, which is higher than the external power voltage Vdd, and the control signal BLSjDP can be applied to the gate of the PMOS transistor P6. The NMOS transistor N8, the PMOS transistor P7, and the PMOS transistor P8 can be connected in series between the output node and the external power voltage Vdd, and the NMOS transistors N9 and N10 can be connected in series between the output node and the ground voltage Vss. The control signal BLSjDP can be applied to the gates of the NMOS transistors N8 and N10. The pulse signal PS having a pulse corresponding to the second period can be applied to the gate of the PMOS transistor P7. The control signal BLEQi can be applied to the gates of the PMOS transistor P8 and the NMOS transistor N9.

Figure 5:
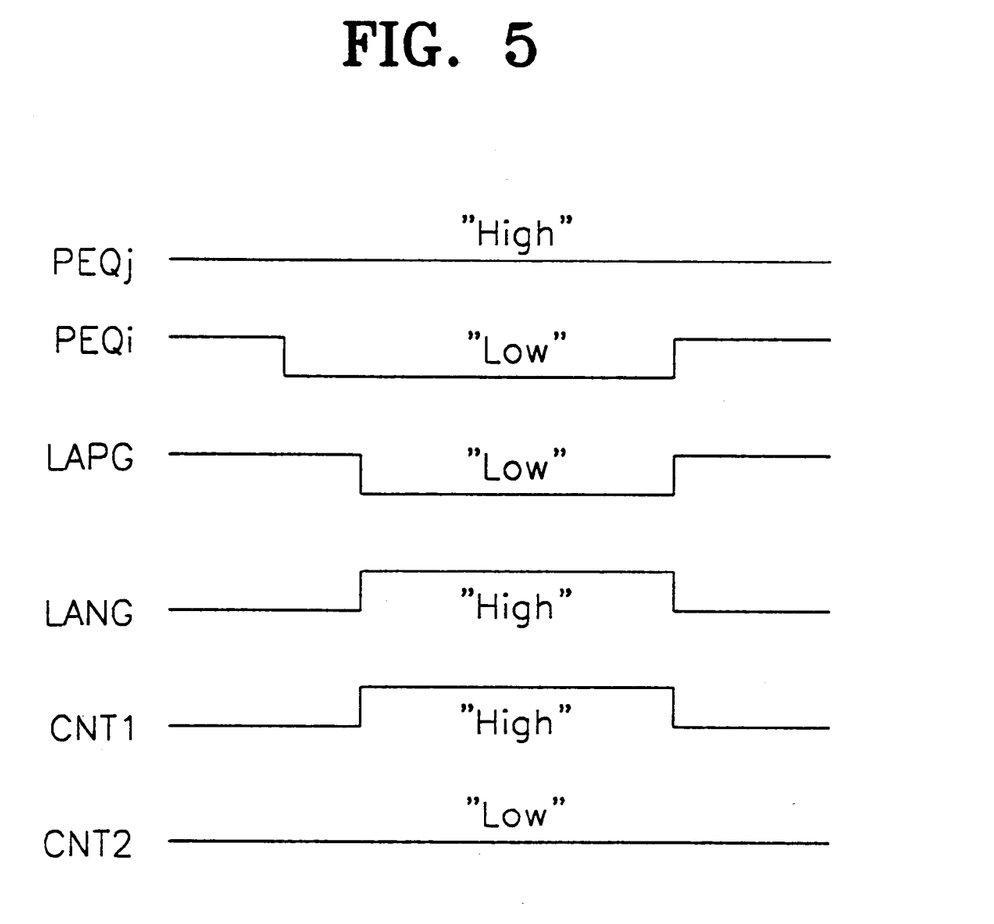
FIG. 5 is a timing diagram illustrating operations of control signal generation circuits according to first embodiments of the present invention.
Figure 6:
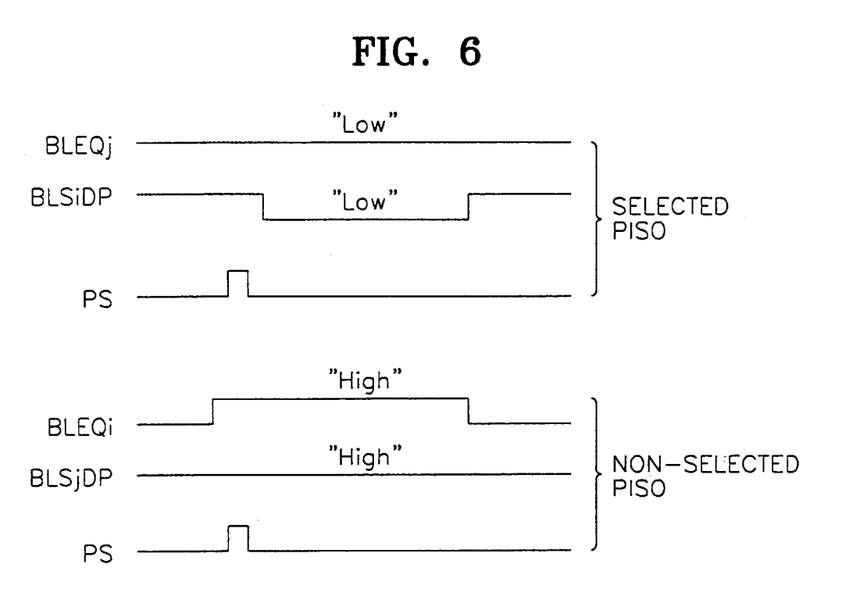
FIG. 6 is a timing diagram illustrating operations of isolation control circuits according to first embodiments of the present invention.

FIG. 5 is a timing diagram illustrating operations of the control signal generation circuit 47A shown in FIG. 4, FIG. 6 is a timing diagram illustrating operations of the isolation control circuit 45 shown in FIG. 4, and FIG. 7 is a waveform diagram illustrating operations of the sense amplifiers S1 through S4 in the DRAM according to first embodiments of the present invention. Hereinafter, the operations of the control signal generation circuit 47A, the isolation control circuit 45, and the sense amplifiers S1 through S4 will be described more fully with reference to FIGS. 5 through 7.

As shown in FIG. 5, in a precharge mode, the first and second equalization signals PEQi and PEQj are logic 'high', the sense amplifier control signal LAPG is logic 'high', and the inverted signal LANG of the sense amplifier control signal is logic 'low'. Accordingly, in the control signal generation circuit 47A, the PMOS transistor P1, the PMOS transistor P2, the NMOS transistor N1, and the NMOS transistor N3 are turned off, and the NMOS transistor N2 and the NMOS transistor N4 are turned on. As a result, the first and second control signals CNT1 and CNT2 are logic 'low', and the third and fourth switches SW3 and SW4 shown in FIG. 4 are turned off. In addition, because the sense amplifier control signal LAPG is logic 'high' and the inverted signal LANG of the sense amplifier control signal LAPG is logic 'low', the first and second switches SW1 and SW2 are turned off, and thus the sense amplifiers S1 through S4 shown in FIG. 4 do not operate.

If the second equalization signal PEQj is maintained at a logic 'high' level, the first equalization signal PEQi becomes logic 'low', the sense amplifier control signal LAPG becomes logic 'low, and the inverted signal LANG of the sense amplifier control signal LAPG becomes logic 'high', then the PMOS transistor P1, the PMOS transistor P2, the NMOS transistor N1, and the NMOS transistor N3 are turned on, and the NMOS transistor N2 and the NMOS transistor N4 are turned off. Accordingly, the logic 'high' value of the second equalization circuit PEQj is transmitted through the PMOS transistor P1 and the NMOS transistor N1 to the gate of switch SW3. In addition, the logic 'low' value of the first equalization signal PEQi is transmitted through the PMOS transistor P2 and the NMOS transistor N3 to the gate of switch SW4, and thus the second control signal CNT2 becomes logic 'low'.

As a result, the third switch SW3 is turned on, and the fourth switch SW4 remains turned off. Because the sense amplifier control signal LAPG is logic 'low', and the inverted signal LANG of the sense amplifier control signal LAPG is logic 'high', the first and second switches SW1 and SW2 are turned on. Accordingly, the first isolation control signal PISOi is transmitted to the power voltage node LA of the sense amplifiers S1 through S4 via the third switch SW3. The memory cell array power voltage Varray is also coupled to the power voltage node LA of the sense amplifiers S1 through S4 via the first switch SW1. The ground voltage Vss is coupled to the ground voltage node LAB of the sense amplifiers S1 through S4 via the second switch SW2. Accordingly, the sense amplifiers S1 through S4 begin to operate.

If the second equalization signal PEQj is logic 'low' and the first equalization signal PEQi is logic 'high, then the first control signal CNT1 becomes logic 'low' and the second control signal CNT2 becomes logic 'high'. As a result, the third switch SW3 is turned off and the fourth switch SW4 is turned on. Thus, the second isolation control signal PISOj is coupled to the power voltage node LA of the sense amplifiers S1 through S4 via the fourth switch SW4.

In the isolation control circuit 45 before performing sense amplification, the control signal BLEQj can be logic 'low', the control signal BLSiDP can be logic 'high', the pulse signal PS is logic 'low', the control signal BLEQi can be logic 'low', and the control signal BLSjDP can be logic 'high'. Accordingly, in the first isolation control signal generator 51, the PMOS transistor P3 and the NMOS transistor N6 can be turned off, and the PMOS transistors P4, and P5 and the NMOS transistors N5 and N7 can be turned on. Thus, the second isolation control signal PISOj can reach the external power voltage level Vdd.

If the control signal BLEQj is maintained at a logic 'low' level, the control signals BLSiDP and BLSjDP are maintained at a logic 'high' level, the pulse signal PS becomes logic 'high', and the control signal BLEQi becomes logic 'high', then the PMOS transistor P5 and the NMOS transistors N5 and N7 are turned on, and the PMOS transistors P3 and P4 and the NMOS transistor N6 are turned off. As a result, the transmission line along which the first isolation control signal PISOi is transmitted may float. In the second isolation control signal generator 53, the NMOS transistors N9 and N10 are turned on, and thus the second isolation control signal PISOj drops to the ground voltage level Vss.

Accordingly, additional electrical charge is not provided from the first isolation control signal generator 51 to the transmission line of the first isolation control signal PISOi during the period when the transmission line of the first isolation control signal PISOi is floating. Then, as described above, during the period when the transmission line of the first isolation control signal PISOi floats, the electrical charge of the transmission line of the first isolation control signal PISOi may be rapidly discharged through the third switch SW3, which is turned on, and the sense amplifiers S1 through S4, and as shown in a portion marked by "a" in FIG. 7, the voltage level of the first isolation control signal PISOi may be significantly lower than the external power voltage level Vdd. The variations in the voltage levels of the first and second isolation control signals PISOi and PISOj are illustrated in FIG. 7.

As shown in FIG. 6, if the control signal BLEQJ is maintained at a logic 'low' level, the control signals BLSjDP and BLEQi are maintained at a logic 'high' level, the control signal BLSiDP is logic 'low', and the pulse signal PS is logic 'low', then the PMOS transistor P3 is turned on, and thus the first isolation control signal PISOi reaches the boosting voltage level Vpp. The second isolation control signal PISOj is maintained at the ground voltage level Vss.

Accordingly, in the semiconductor memory device according to first embodiments of the present invention, the pairs of first isolation transistors T1 through T8 can be completely turned off by reducing a voltage of the first isolation control signal PISOi to be significantly lower than the external power voltage level Vdd at an early stage of the operation of the sense amplifiers S1 through S4. Then, the load of the pairs of bitlines BL0i/BL0Bi through BL3i/BL3Bi can be sufficiently blocked, and the amplification speed of the sense amplifiers S1 through S4 can be increased.

The electric charges of the first or second isolation control signal PISOi or PISOj can be continuously discharged to the power voltage node LA of the sense amplifiers S1 through S4 until the voltage level of the bitline BL reaches Vdd−Vthn. If the voltage level of the bitline BL exceeds Vdd−Vthn, the NMO transistors (SW3 and SW4) are turned off.

Here, Vthn represents the threshold voltage of the NMOS transistors SW3 and SW4.

Figure 8:
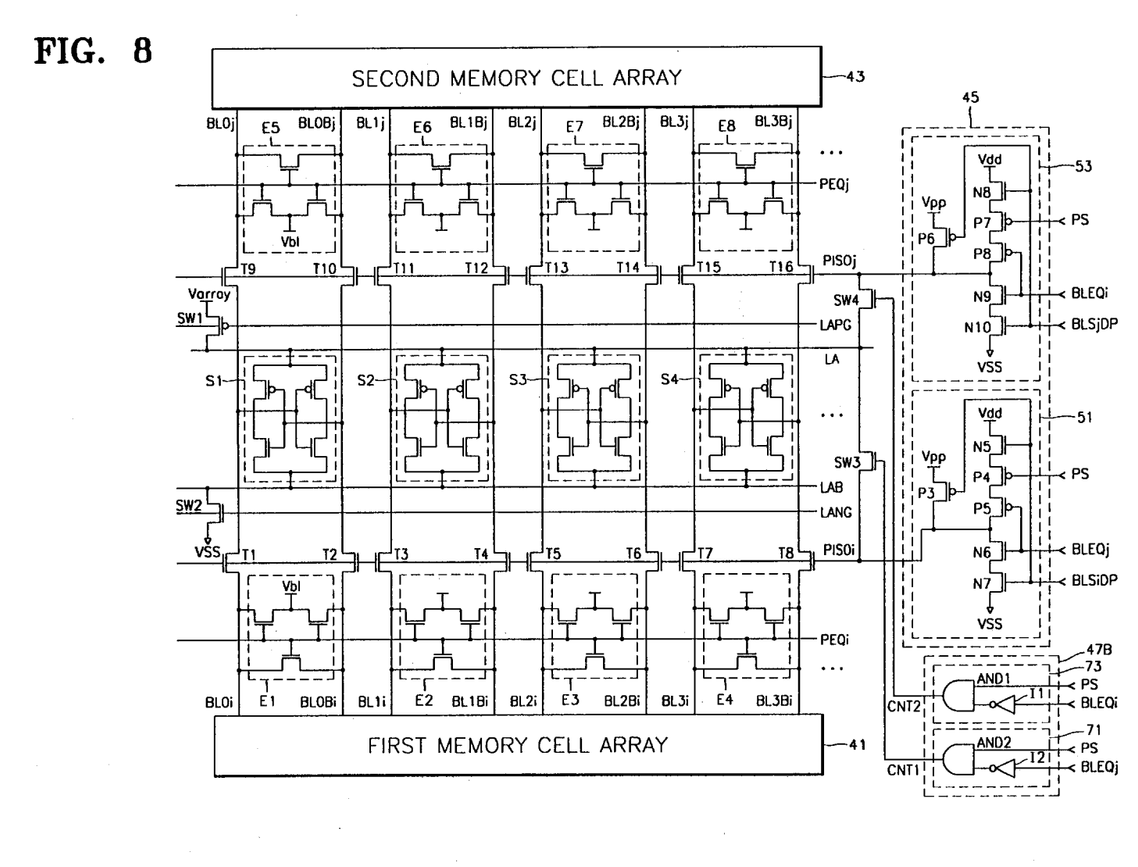
FIG. 8 is a circuit diagram of DRAMs according to second embodiments of the present invention.

FIG. 8 is a circuit diagram of a DRAM according to second embodiments of the present invention. Referring to FIG. 8, in the DRAM according to second embodiments of the present invention, unlike the DRAM according to first embodiments of the present invention, the third and fourth switches SW3 and SW4 are arranged in a peripheral circuit region, and the control signal generation circuit 47B is also arranged in the peripheral circuit region. In addition, the structure of a control signal generation circuit 47B is different from the structure of the control signal generation circuit 47A of the DRAM according to first embodiments of the present invention. However, the other elements of the DRAM according to second embodiments of the present invention are the same as those of the DRAM according to first embodiments of the present invention.

The third and fourth switches SW3 and SW4 may each comprise an NMOS transistor. The control signal generation circuit 47B can include a first control signal generator 71 for generating the first control signal CNT1' in response to the pulse signal PS and the control signal BLEQj and a second control signal generator 73 for generating the second control signal CNT2' in response to the pulse signal PS and the control signal BLEQi.

The first control signal generator 71 includes an inverter 12 for inverting the control signal BLEQj and an AND gate AND2 for performing an AND operation on the output signal of the inverter 12 and the pulse signal PS and providing the result as the first control signal CNT1'. The second control signal generator 73 includes an inverter 11 for inverting the signal BLEQi and an AND gate AND1 for performing an AND operation on the output signal of the inverter 11 and the pulse signal PS and providing the result as the second control signal CNT2'.

Figure 9:
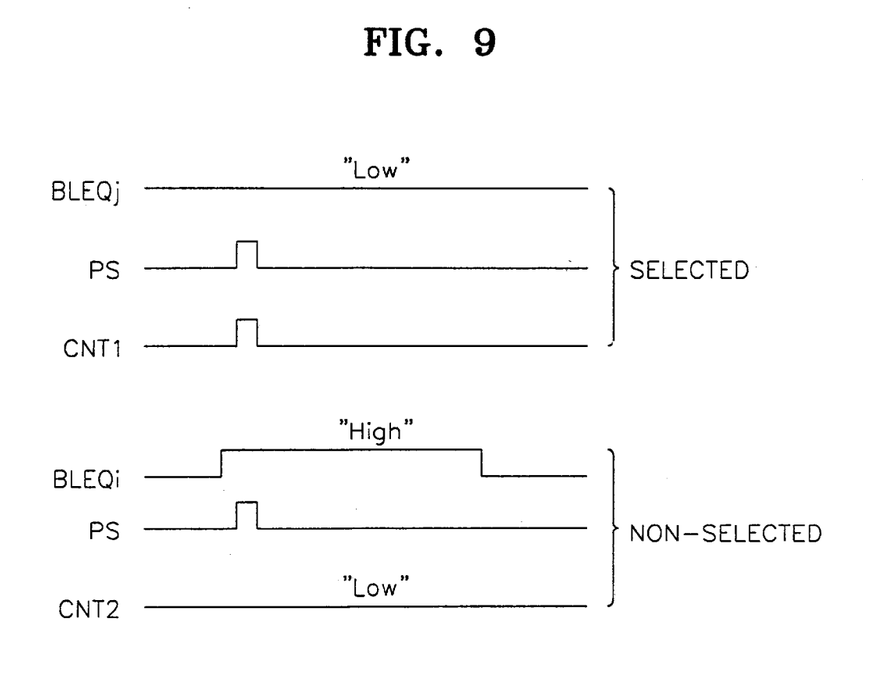
FIG. 9 is a timing diagram illustrating operations of control signal generation circuits according to second embodiments of the present invention.

FIG. 9 is a timing diagram illustrating the operation of the control signal generation circuit 47B shown in FIG. 8. Referring to FIG. 9, if the control signal BLEQj is logic 'low', the pulse signal PS is logic 'low', and the control signal BLEQi is logic 'low', then the first and second control signals CNT1' and CNT2' become logic 'low'. Next, if the control signal BLEQj is maintained at a logic 'low' level, the pulse signal PS becomes logic 'high', and the control signal BLEQi becomes logic 'high', the the first control signal CNT1 becomes logic 'high' and the second control signal CNT2' becomes logic 'low'. In other words, the first control signal CNT1' becomes logically the same as the pulse signal PS, and the logic 'high' period of the first control signal CNT1 occurs when the transmission line of the first isolation control signal PISOi floats.

Accordingly, in semiconductor memory devices according to second embodiments of the present invention, the third switch SW3 is turned on during the period when the transmission line of the first isolation control signal PISOi floats, in other words, during the logic 'high' period of the first control signal CNT1'. The basic operation of the semiconductor memory device according to second embodiments is the same as that of the semiconductor memory device according to first embodiments of the present invention, and thus its description will be omitted here.

Figure 10:
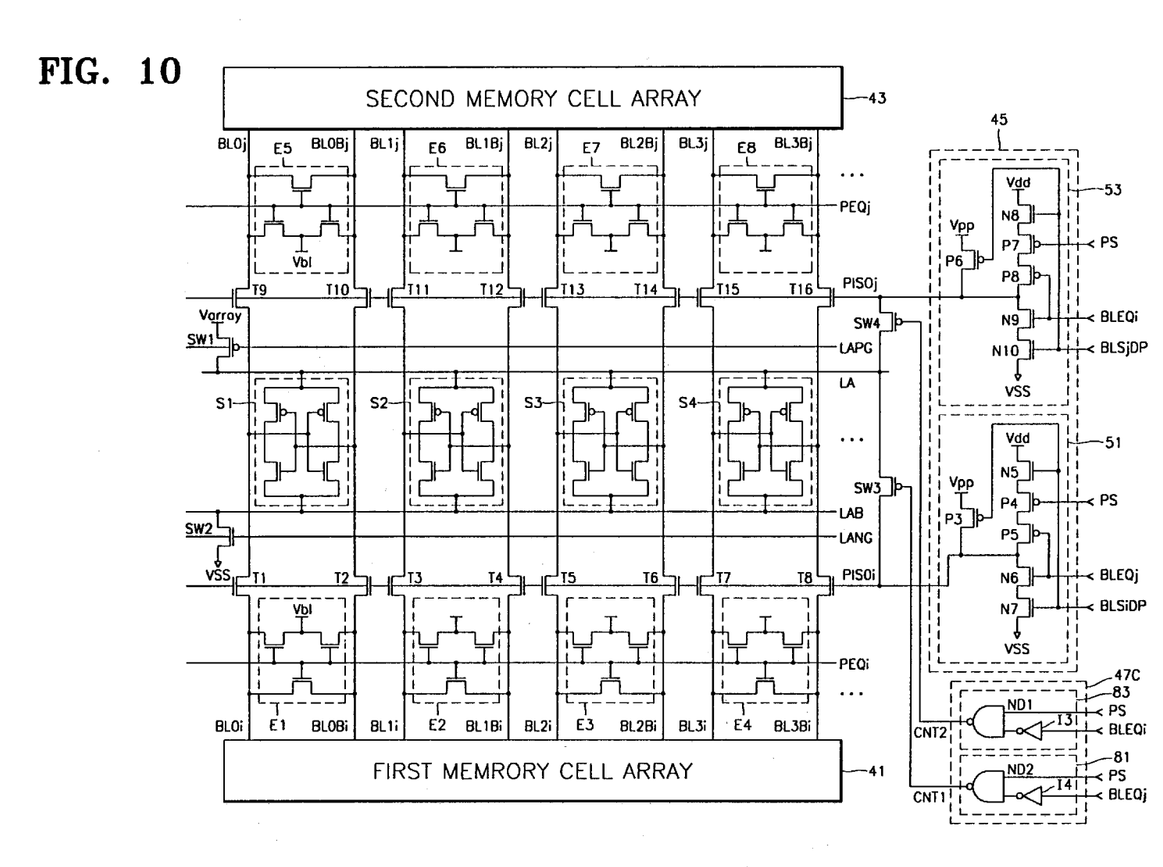
FIG. 10 is a circuit diagram of DRAMs according to third embodiments of the present invention.

FIG. 10 is a circuit diagram of a DRAM according to third embodiments of the present invention. Referring to FIG. 10, in DRAMs according to third embodiments of the present invention, the third and fourth switches may each comprise a PMOS transistor, and accordingly, the structure of a control signal generation circuit 47C is different from that of the control signal generation circuit 47B in DRAMS according to second embodiments of the present invention. The third and fourth switches SW3" and SW4", and the control signal generation circuit 47C may be arranged in a peripheral circuit region. Other elements of DRAMS according to third embodiments of the present invention are similar to those of DRAMS according to first or second embodiments of the present invention.

The control signal generation circuit 47C includes a first control signal generator 81 for generating the first control signal CNT1" in response to the pulse signal PS and the control signal BLEQj and a second control signal generator 83 for generating the second control signal CNT2" in response to the pulse signal PS and the control signal BLEQi.

The first control signal generator 81 includes an inverter 14 for inverting the control signal BLEQj and a NAND gate ND2 for performing an AND operation on the output signal of the inverter 14 and the pulse signal PS, inverting the result, and providing the inverted result as the first control signal CNT1". The second control signal generator 83 includes an inverter 13 for inverting the control signal BLEQi and a NAND gate ND1 for performing an AND operation on the output signal of the inverter 13 and the pulse signal PS, inverting the result, and providing the inverted result as the second control signal CNT2".

Figure 11:
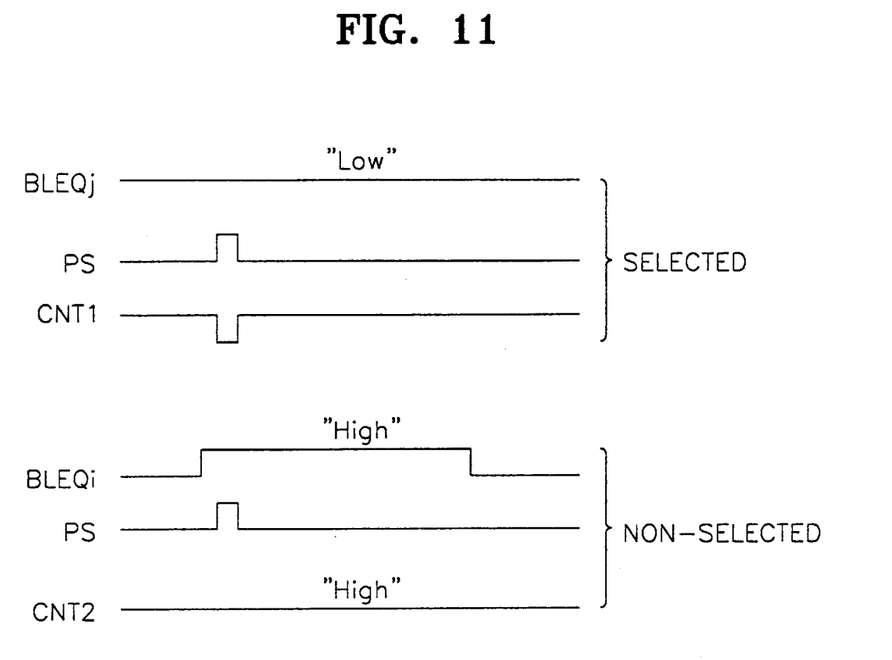
FIG. 11 is a timing diagram illustrating operations of control signal generation circuits according to third embodiments of the present invention.

FIG. 11 is a timing diagram illustrating the operation of the control signal generation circuit 47C shown in FIG. 10. Referring to FIG. 11, if the control signal BLEQj is logic 'low', the pulse signal is logic 'low', and the signal BLEQi is logic 'low', then the first and second control signals CNT1" and CNT2" become logic 'high'. Next, if the control signal BLEQj is maintained at a logic 'low' level, the pulse signal PS becomes logic 'high', and the signal BLEQi becomes logic 'high', then the first control signal CNT1" becomes logic 'low' and the second control signal CNT2" becomes logic 'high'. In other words, the first control signal CNT1" becomes an inverted signal of the pulse signal PS and the logic 'low' period of the first control signal CNT1" occurs when the transmission line of the first isolation control signal PISOi floats.

Accordingly, in semiconductor memory devices according to third embodiments of the present invention, the third switch SW3" is turned on during the period when the transmission line of the first isolation control signal PISOi floats, in other words, during the logic 'low' period of the first control signal CNT1. The basic operation of the semiconductor memory device according to third embodiment is the same as that of the semiconductor memory device according to first embodiments of the present invention, and thus its description will be omitted here.

As described above, in the semiconductor memory device according to embodiments of the present invention, the load of pairs of bitlines can be sufficiently blocked at an early stage of the operation of sense amplifiers, so that an amplification speed of the sense amplifiers can be increased.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor memory device comprising:
a memory cell array comprising a plurality of memory cells;
a pair of bit lines coupled to at least one memory cell of the memory cell array;
a sense amplifier having a pair of sense amplifier inputs wherein the sense amplifier senses a difference between voltages of the pair of sense amplifier inputs and amplifies the voltage difference;
a pair of isolation switches wherein each isolation switch of the pair is coupled between one of the pair of bit lines and one of the pair of sense amplifier inputs wherein the pair of isolation switches electrically couples the respective bit lines and the sense amplifier inputs responsive to a coupling signal provided on an isolation control signal line coupled to control electrodes of the isolation switches;
a control switch coupled between the isolation control signal line and a power voltage node of the sense amplifier wherein the control switch electrically couples the isolation control signal line to the power voltage node of the sense amplifier during a first period of operation of the sense amplifier for the memory cell.

2. An integrated circuit memory device according to claim 1 wherein the control switch electrically decouples the isolation control signal line from the power voltage node of the sense amplifier during a second period of operation of the sense amplifier for the memory cell.

3. An integrated circuit memory device according to claim 2 wherein the second period of operation of the sense amplifier is subsequent to the first period of operation of the sense amplifier for the memory cell.

4. An integrated circuit memory device according to claim 3 further comprising:
a sense amplifier power source wherein the sense amplifier power source is electrically coupled with the power voltage node of the sense amplifier during the first and second periods of operation of the sense amplifier for the memory cell.

5. An integrated circuit memory device according to claim 4 further comprising:
a sense amplifier power source switch coupled between the sense amplifier power source and the power voltage node of the sense amplifier wherein the sense amplifier power source switch electrically couples the sense amplifier power source and the power voltage node of the sense amplifier during the first and second periods of operation of the sense amplifier for the memory cell and wherein the sense amplifier power source switch electrically decouples the sense amplifier power source and the power voltage node of the sense amplifier for a period of time after operation of the sense amplifier for the memory cell.

6. An integrated circuit memory device according to claim 1 further comprising:
an isolation control signal generator coupled to the isolation control signal line wherein the isolation control signal generator allows the isolation control signal line to float with respect to the isolation control signal generator during the first period of operation of the sense amplifier for the memory cell array.

7. An integrated circuit memory device according to claim 6 wherein the isolation control signal generator generates the coupling signal on the isolation control signal line during a second period of operation of the sense amplifier for the memory cell array.

8. An integrated circuit memory device according to claim 7 wherein the second period of operation of the sense amplifier is subsequent to the first period of operation of the sense amplifier for the memory cell.

9. An integrated circuit memory device according to claim 6 wherein the isolation control signal generator allows the isolation control signal line to float by providing a high impedance termination for the isolation control signal line.

10. An integrated circuit memory device according to claim 6 further comprising:
a second memory cell array including a second plurality of memory cells;
a second pair of bit lines coupled to at least one memory cell of the second memory cell array;
a second pair of isolation switches wherein each isolation switch of the second pair is coupled between one of the bit lines of the second pair of bit lines and one of the sense amplifier inputs wherein the second pair of isolation switches electrically couples the second pair of bit lines and respective sense amplifier inputs responsive to a second coupling signal provided on a second isolation control signal line coupled to control electrodes of the second pair of isolation switches and wherein the second pair of isolation switches electrically decouple the second pair of bit lines and respective sense amplifier inputs responsive to a second decoupling signal provided on the second isolation control signal line;
a second isolation control signal generator coupled to the second isolation control signal line wherein the second isolation control signal generator generates the second decoupling signal while the first isolation control signal generator allows the first isolation control signal line to float during the initial period of operation of the sense amplifier for the first memory cell array.

11. An integrated circuit memory device comprising:
a memory cell array comprising a plurality of memory cells;
a pair of bit lines coupled to at least one memory cell of the memory cell array;
a sense amplifier having a pair of sense amplifier inputs wherein the sense amplifier senses a difference between voltages of the pair of sense amplifier inputs and amplifies the voltage difference;
a pair of isolation switches wherein each isolation switch of the pair is coupled between one of the pair of bit lines and one of the pair of sense amplifier inputs wherein the isolation switches electrically couple the respective bit lines and the sense amplifier inputs responsive to a coupling signal provided on an isolation control signal line coupled to control electrodes of the isolation switches;
an isolation control signal generator coupled to the isolation control signal line wherein the isolation control signal generator generates the coupling signal during operation of the sense amplifier for the memory cell array, and wherein the isolation control signal generator allows the isolation control signal line to float with respect to the isolation control signal generator during a first period of operation of the sense amplifier for the memory cell array.

12. An integrated circuit memory device according to claim 11 wherein the isolation control signal generator allows the isolation control signal line to float by providing a high impedance termination for the isolation control signal line.

13. An integrated circuit memory device according to claim 11 further comprising:
a second memory cell array including a second plurality of memory cells;
a second pair of bit lines coupled to at least one memory cell of the second memory cell array;
a second pair of isolation switches wherein each isolation switch of the second pair is coupled between one of the bit lines of the second pair of bit lines and one of the sense amplifier inputs wherein the second pair of isolation switches electrically couples the second pair of bit lines and respective sense amplifier inputs responsive to a second coupling signal provided on a second isolation control signal line coupled to control electrodes of the second pair of isolation switches and wherein the second pair of isolation switches electrically decouple the second pair of bit lines and respective sense amplifier inputs responsive to a second decoupling signal provided on the second isolation control signal line;
a second isolation control signal generator coupled to the second isolation control signal line wherein the second isolation control signal generator generates the decoupling signal while the first isolation control signal generator allows the first isolation control signal line to float during the initial period of operation of the sense amplifier for the first memory cell array.

14. An integrated circuit memory device according to claim 11 further comprising:
a control switch coupled between the isolation control signal line and a power voltage node of the sense amplifier wherein the control switch electrically couples the isolation control signal line to the power voltage node of the sense amplifier during the first period of operation of the sense amplifier for the memory cell array.

15. An integrated circuit memory device according to claim 14 wherein the control switch electrically decouples the isolation control signal line from the power voltage node of the sense amplifier during a second period of operation of the sense amplifier for the memory cell.

16. An integrated circuit memory device according to claim 15 wherein the second period of operation of the sense amplifier is subsequent to the first period of operation of the sense amplifier for the memory cell.

17. An integrated circuit memory device according to claim 16 further comprising:
a sense amplifier power source wherein the sense amplifier power source is electrically coupled with the power voltage node of the sense amplifier during the first and second periods of operation of the sense amplifier for the memory cell.

18. An integrated circuit memory device according to claim 17 further comprising:
a sense amplifier power source switch coupled between the sense amplifier power source and the power voltage node of the sense amplifier wherein the sense amplifier power source switch electrically couples the sense amplifier power source and the power voltage node of the sense amplifier during the first and second periods of operation of the sense amplifier for the memory cell and wherein the sense amplifier power source switch electrically decouples the sense amplifier power source and the power voltage node of the sense amplifier for a period of time after operation of the sense amplifier for the memory cell.

19. A method of operating a semiconductor memory device comprising a memory cell array comprising a plurality of memory cells, a pair of bit lines coupled to at least one memory cell of the memory cell array, a sense amplifier having a pair of sense amplifier inputs wherein the sense amplifier senses a difference between voltages of the pair of sense amplifier inputs and amplifies the voltage difference, and a pair of isolation switches wherein each isolation switch of the pair is coupled between one of the pair of bit lines and one of the pair of sense amplifier inputs wherein the pair of isolation switches electrically couples the respective bit lines and the sense amplifier inputs responsive to a coupling signal provided on an isolation control signal line coupled to control electrodes of the isolation switches, the method comprising:

electrically coupling the isolation control signal line to a power voltage node of the sense amplifier during a first period of operation of the sense amplifier for the memory cell.

20. A method according to claim 19 further comprising:
electrically decoupling the isolation control signal line from the power voltage node of the sense amplifier during a second period of operation of the sense amplifier for the memory cell.

21. A method according to claim 20 wherein the second period of operation of the sense amplifier is subsequent to the first period of operation of the sense amplifier for the memory cell.

22. A method according to claim 21 further comprising:
electrically coupling a sense amplifier power source with the power voltage node of the sense amplifier during the first and second periods of operation of the sense amplifier for the memory cell.

23. A method according to claim 22 further comprising:
electrically coupling the sense amplifier power source and the power voltage node of the sense amplifier during the first and second periods of operation of the sense amplifier for the memory cell; and
electrically decoupling the sense amplifier power source and the power voltage node of the sense amplifier for a period of time after operation of the sense amplifier for the memory cell.

24. A method according to claim 19 further comprising:
allowing the isolation control signal line to float with respect to an isolation control signal generator during the first period of operation of the sense amplifier for the memory cell array.

25. A method according to claim 24 wherein the coupling signal is generated on the isolation control signal line during a second period of operation of the sense amplifier for the memory cell array.

26. A method according to claim 25 wherein the second period of operation of the sense amplifier is subsequent to the first period of operation of the sense amplifier for the memory cell.

27. A method according to claim 24 wherein the isolation control signal generator allows the isolation control signal line to float by providing a high impedance termination for the isolation control signal line.

28. A method of operating an integrated circuit memory device comprising
a memory cell array comprising a plurality of memory cells, a pair of bit lines coupled to at least one memory cell of the memory cell array, a sense amplifier having a pair of sense amplifier inputs wherein the sense amplifier senses a difference between voltages of the pair of sense amplifier inputs and amplifies the voltage difference, and a pair of isolation switches wherein each isolation switch of the pair is coupled between one of the pair of bit lines and one of the pair of sense amplifier inputs wherein the isolation switches electrically couple the respective bit lines and the sense amplifier inputs responsive to a coupling signal provided on an isolation control signal line coupled to control electrodes of the isolation switches, the method comprising:

generating the coupling signal on the isolation control signal line from an isolation control signal generator during operation of the sense amplifier for the memory cell array; and
allowing the isolation control signal line to float with respect to the isolation control signal generator during a first period of operation of the sense amplifier for the memory cell array.

29. A method according to claim 28 wherein allowing the isolation control signal line to float with respect to the isolation control signal generator comprises providing a high impedance termination for the isolation control signal line at the isolation control signal generator.

30. A method according to claim 28 further comprising:
electrically coupling the isolation control signal line to the power voltage node of the sense amplifier during the first period of operation of the sense amplifier for the memory cell array.

31. A method according to claim 30 further comprising:
electrically decoupling the isolation control signal line from the power voltage node of the sense amplifier during a second period of operation of the sense amplifier for the memory cell.

32. A method according to claim 31 wherein the second period of operation of the sense amplifier is subsequent to the first period of operation of the sense amplifier for the memory cell.

33. A method according to claim 32 further comprising:
electrically coupling a sense amplifier power source with the power voltage node of the sense amplifier during the first and second periods of operation of the sense amplifier for the memory cell.

34. A method according to claim 33 further comprising:
electrically coupling the sense amplifier power source and the power voltage node of the sense amplifier during the first and second periods of operation of the sense amplifier for the memory cell; and
electrically decoupling the sense amplifier power source and the power voltage node of the sense amplifier for a period of time after operation of the sense amplifier for the memory cell.

35. A semiconductor memory device comprising:
a memory cell array block;
a pair of bitlines connected to the memory cell array block;
a sense amplifier for sensing a difference between the voltages of the pair of bitlines and amplifying the voltage difference;
a pair of isolation transistors for connecting/isolating the pair of bitlines to/from an input pair of the sense amplifier in response to an isolation control signal;
a first switch for transmitting a memory cell array power voltage to a power voltage node of the sense amplifier in response to a sense amplifier control signal;
a second switch for transmitting the isolation control signal to the power voltage node of the sense amplifier in response to the activation of a control signal;
a control signal generation circuit for generating the control signal and activating the control signal for a first period during the operation of the sense amplifier; and an isolation control circuit for generating the isolation control signal and floating a transmission line of the isolation control signal for a second period during the activation of the control signal.

36. The semiconductor memory device of claim 35, wherein the second switch is an NMOS transistor.

37. The semiconductor memory device of claim 35, wherein the second switch is a PMOS transistor.

38. A semiconductor memory device comprising:

a first memory cell array block;

a pair of first bitlines connected to the first memory cell array block a second memory cell array block;

a pair of second bitlines connected to the second memory cell array block;

a sense amplifier for sensing a difference between the voltages of the pair of first bitlines or between the voltages of the pair of second bitlines and amplifying the voltage difference;

a pair of first isolation transistors for connecting/isolating the pair of first bitlines to/from an input pair of the sense amplifier in response to a first isolation control signal;

a pair of second isolation transistors for connecting/ isolating the pair of second bitlines to/from the input pair of the sense amplifier in response to a second isolation control signal;

a first switch for transmitting a memory cell array power voltage to a power voltage node of the sense amplifier in response to a sense amplifier control signal;

a second switch for transmitting the first isolation control signal to the power voltage node of the sense amplifier in response to the activation of a first control signal;

a third switch for transmitting the second isolation control signal to the power voltage node of the sense amplifier in response to the activation of a second control signal;

a control signal generation circuit for generating the first and second control signals and activating the first or second control signal for a first period during the operation of the sense amplifiers; and an isolation control circuit for generating the first and second isolation control signals and floating a transmission line of the first isolation control signal for a second period during the activation of the first control signal or floating a transmission line of the second isolation control signal for a second period during the activation of the second control signal.

39. The semiconductor memory device of claim 38 further comprising:

a first equalizer for equalizing the pair of first bitlines in response to a first equalization signal; and a second equalizer for equalizing the pair of second bitlines in response to a second equalization signal.

40. The semiconductor memory device of claim 39, wherein the control signal generation circuit comprises:

a first control signal generator for generating the first control signal in response to the sense amplifier control signal, an inverted signal of the sense amplifier control signal, and the second equalization signal and activating the first control signal for the first period during the operation of the sense amplifier; and a second control signal generator for generating the second control signal in response to the sense amplifier control signal, the inverted signal of the sense amplifier control signal, and the first equalization signal and activating the second control signal for the first period.

41. The semiconductor memory device of claim 40, wherein the second and third switches are NMOS transistors.

42. The semiconductor memory device of claim 41, wherein the first control signal generator comprises:

a PMOS transistor having a source and a drain, to one of which the second equalization signal is applied and to the other of which the first control signal is output, and a gate to which the sense amplifier control signal is applied;

a first NMOS transistor having a source and a drain, to one of which the second equalization signal is applied and to the other of which the output node is connected, and a gate to which the inverted signal of the sense amplifier control signal is applied; and a second NMOS transistor having a source and a drain, to one of which the output node is connected and to the other of which ground voltage is applied, and a gate to which the sense amplifier control signal is applied.

43. The semiconductor memory device of claim 41, wherein the second control signal generator comprises:

a PMOS transistor having a source and a drain, to one of which the first equalization signal is applied and to the other of which the second control signal is output, and a gate to which to which the sense amplifier control signal is applied;

a first NMOS transistor having a source and a drain, to one of which the first equalization signal is applied and to the other of which the output node is connected, and a gate to which the inverted signal of the sense amplifier control signal is applied; and a second NMOS transistor having a source and a drain, to one of which the output node is connected and to the other of which the ground voltage is applied, and a gate to which the sense amplifier control signal is applied.

44. The semiconductor memory device of claim 38, wherein the isolation control circuit comprises:

a first isolation control signal generator for generating the first isolation control signal and floating the transmission line of the first isolation control signal for the second period during the activation of the first control signal; and a second isolation control signal generator for generating the second isolation control signal and floating the transmission line of the second isolation control signal for the second period during the activation of the second control signal.

45. The semiconductor memory device of claim 44, wherein the first isolation control signal generator comprises:

a first PMOS transistor connected between an output node to which the first isolation control signal is output and a boosting voltage, which is higher than an external power voltage;

first, second, and third PMOS transistors connected in series between the output node and the external power voltage; and second and third NMOS transistors connected in series between the output node and a ground voltage, wherein a first signal is applied to the gates of the first PMOS transistor, the first NMOS transistor, and the third NMOS transistor, a pulse signal having a pulse corresponding to the second period is applied to the gate of the second PMOS transistor, a second signal is applied to the gates of the third PMOS transistor and the second NMOS transistor.

46. The semiconductor memory device of claim 45, wherein the second isolation control signal generator comprises:
a first PMOS transistor connected between an output node to which the second isolation control signal is output and a boosting voltage which is higher than an external power voltage;
first, second, and third PMOS transistors connected in series between the output node and the external power voltage; and
second and third NMOS transistors connected in series between the output node and a ground voltage,
wherein a first signal is applied to the gates of the first PMOS transistor, the first NMOS transistor, and the third NMOS transistor, a pulse signal having a pulse corresponding to the second period is applied to the gate of the second PMOS transistor, and a second signal is applied to the gates of the third PMOS transistor and the second NMOS transistor.

47. The semiconductor memory device of claim 38, wherein the control signal generation circuit comprises:
a first control signal generator for generating the first control signal in response to a predetermined pulse signal having a pulse corresponding to the second period and a first signal and activating the first control signal for the pulse period; and
a second control signal generator for generating the second control signal in response to the pulse signal and a second signal and activating the second control signal for the pulse period.

48. The semiconductor memory device of claim 47, wherein the second and third switches are NMOS transistors.

49. The semiconductor memory device of claim 48, wherein the first control signal generator comprises:
an inverter for inverting the first signal; and
an AND gate for performing an AND operation on the output signal of the inverter and the pulse signal and providing the result as the first control signal.

50. The semiconductor memory device of claim 48, wherein the second control signal generator comprises:
an inverter for inverting the second signal; and
an AND gate for performing an AND operation on the output signal of the inverter and the pulse signal and providing the result as the second control signal.

51. The semiconductor memory device of claim 47, wherein the second and third switches are PMOS transistors.

52. The semiconductor memory device of claim 51, wherein the first control signal generator comprises:
an inverter for inverting the first signal; and
a NAND gate for performing an AND operation on the output signal of the inverter and the pulse signal, inverting the result, and providing the inverted result as the first control signal.

53. The semiconductor memory device of claim 51, wherein the second control signal generator comprises:
an inverter for inverting the second signal; and
a NAND gate for performing an AND operation on the output signal of the inverter and the pulse signal, inverting the result, and providing the inverted result as the second control signal.

* * * * *